United States Patent
Ramanujam et al.

(10) Patent No.: US 6,622,277 B1
(45) Date of Patent: Sep. 16, 2003

(54) CONCATENATED FORWARD ERROR CORRECTION DECODER

(75) Inventors: Nandakumar Ramanujam, Morganville, NJ (US); Bo Pedersen, Rumson, NJ (US)

(73) Assignee: Tyco Telecommunications(US)Inc., Morristown, NJ (US)

( * ) Notice: Subject to any disclaimer, the term of this patent is extended or adjusted under 35 U.S.C. 154(b) by 198 days.

(21) Appl. No.: 09/589,215

(22) Filed: Jun. 7, 2000

Related U.S. Application Data

(63) Continuation-in-part of application No. 09/587,741, filed on Jun. 5, 2000.

(51) Int. Cl.$^7$ ............................................. H03M 13/00
(52) U.S. Cl. ...................................... 714/755; 714/776
(58) Field of Search ................................ 714/755, 756, 714/776

(56) References Cited

U.S. PATENT DOCUMENTS

| | | | | |
|---|---|---|---|---|
| 5,392,299 A | * | 2/1995 | Rhines et al. ................ | 714/756 |
| 5,719,884 A | * | 2/1998 | Roth et al. .................... | 714/755 |
| 5,809,042 A | * | 9/1998 | Nakamura et al. ........... | 714/756 |
| 5,812,601 A | * | 9/1998 | Schramm ...................... | 375/262 |
| 6,366,776 B1 | * | 4/2002 | Wright et al. ................ | 455/427 |
| 6,400,393 B1 | * | 6/2002 | Limberg ........................ | 348/21 |

OTHER PUBLICATIONS

Ait Sab, J. Fang: "Concatenated Forward Error Correction Schemes for Long–haul DWDM Optical Transmission Systems", Proceedings of ECOC'99, vol. 2, pp 290–291, Nice, France, 1999.*

Baggen, C.P.M.J.; Tolhuizen, L.M.G.M.; On Diamond codes; IEEE Transactions on Information Theory, vol.: 43 Issue: 5, Sep. 1997 pp.: 1400–1411.*

O. Ait Sab et al., "Block Turbo Code Performances for Long–Haul DWDM Optical Transmission Systems", *Optical Fiber Communication Conference. Technical Digest Postconference Edition. Trends in Optics and Photonics*, vol. 37 (IEEE Cat. No. 00CH37079), Mar. 7–10, 2000, pp. 280–282, vol. 3, XP–002181576, Baltimore, MD ISBN: 1–55752–630–3.

A. Puc et al., "Concatenated FEC Experiment over 5000 km Long Straight Line WDM Test Bed", OFC/IOOC '99, *Optical Fiber Communication Conference and the International Conference on Integrated Optics and Optical Fiber Communications* (Cat. No. 99CH36322), Feb. 21–26, 1999, pp. 255–258, vol. 3, XP–002181577, San Diego, CA.

D. N. Kalofonos et al., "Performance Comparisons of Concatenated Codes with Iterative Decoding for DS–CDMA Systems with Application to IS–95–Based Cellular Systems", *WCNC. IEEE Wireless Communications and Networking Conference*, vol. 1, Sep. 21, 1999, pp. 461–465, XP–002150138.

* cited by examiner

*Primary Examiner*—Albert Decady
*Assistant Examiner*—Joseph D. Torres

(57) ABSTRACT

A method and apparatus to perform error correction is described. A stream of data is encoded using concatenated error correcting codes. The encoded data is communicated over a long-haul transmission system. The encoded data is decoded using the codes and three levels of decoding.

16 Claims, 9 Drawing Sheets

CONCATENATED FORWARD ERROR CORRECTION DECODER

CROSS REFERENCE TO RELATED APPLICATION

The present application is a continuation-in-part of U.S. patent application Ser. No. 09/587,741 filed on Jun. 5, 2000 entitled METHOD AND APPARATUS FOR ENHANCED FORWARD ERROR CORRECTION IN A NETWORK and assigned to the assignee of the present application.

FIELD OF THE INVENTION

The invention relates to communications networks in general. More particularly, the invention relates to a method and apparatus to perform forward error correction in a network such as a long-haul communications network.

BACKGROUND OF THE INVENTION

Long-haul communication networks are designed to carry information over relatively long distances, typically in the range of 600–10,000 kilometers. Examples of long-haul communications systems include "undersea" or "submarine" systems that carry signals from one continent to another (e.g., North America to Europe). These systems are typically optical systems given the advantages in terms of capacity and reliability.

One problem associated with long-haul communication systems is maintaining the integrity of the data being communicated. All communication systems are susceptible to noise and pulse distortion to some extent. Long-haul communication systems are particular susceptible to noise and pulse distortion given the greater distances over which they carry information.

Forward Error Correction (FEC) is a technique used to help compensate for this distortion. FEC is essentially the incorporation of a suitable code into a data stream, for the detection and correction of data errors without any previously known information. A transmitter receives a data stream and encodes the data stream using an FEC encoder. The FEC encoder generates a code for a block of data, which is appended to the block of data. The transmitter sends the encoded block of data over the network. A receiver receives the encoded block of data and runs it through an FEC decoder. The FEC decoder recovers the code and uses it to detect and correct any errors within the received block of data.

The use of FEC in a system provides "margin improvements" to the system. The margin improvements can be used to increase amplifier spacing or increase system capacity. In a Wavelength Division Multiplexing (WDM) system, the margin improvement can be used to increase the bit rate of each WDM channel, or decrease the spacing between WDM channels thereby allowing more channels for a given amplifier bandwidth. Consequently, improvements in FEC techniques directly translate into increased capacity for long-haul communication systems. Accordingly, it can be appreciated that a substantial need exists for an enhanced FEC method and apparatus that improves margin requirements and therefore system capacity.

SUMMARY OF THE INVENTION

One embodiment of the invention comprises a method and apparatus to perform error correction. A stream of data is encoded using concatenated error correcting codes. The encoded data is communicated over a long-haul transmission system. The encoded data is decoded using the codes and three levels of decoding.

With these and other advantages and features of the invention that will become hereinafter apparent, the nature of the invention may be more clearly understood by reference to the following detailed description of the invention, the appended claims and to the several drawings attached herein.

DETAILED DESCRIPTION

Figure 1:
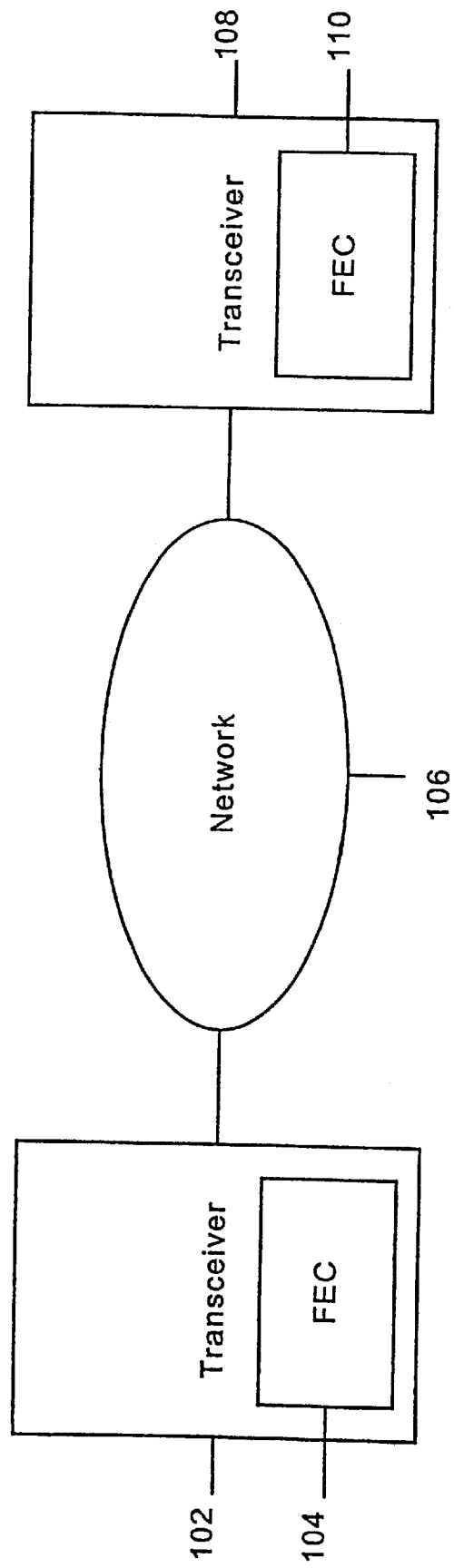
FIG. 1 illustrates a system suitable for practicing one embodiment of the invention.

The embodiments of the invention include a method and apparatus to increase coding gains in a long-haul communications system using concatenated error-correcting codes ("concatenated codes" or "product codes") in conjunction with a three level decoder. A long-haul communications system is defined herein to include any system designed to transport signals over a distance of greater than 600 kilometers. Concatenated codes refer to the use of two or more levels of FEC coding. The performance improvement from concatenated codes arises from the fact that any residual errors from one level of decoding will be corrected in the second or third levels of decoding.

The coding gains for the embodiments of the invention are realized using concatenated codes and two levels of encoding to improve system performance. Concatenated codes are particularly suitable for long-haul communications systems since they increase error correction capabilities with a slight incremental increase in redundancy. Furthermore, RS concatenated codes are well-suited for long-haul communications systems since they tend to work well in "bursty" environments. Long-haul communications systems, especially undersea or submarine systems, tend to have more bursty traffic than other systems.

The coding gains for the embodiments of the invention are also realized using three levels of decoding to further improve system performance. In essence, the two levels of encoding are matched at the receiving end by two levels of decoding. In addition, the received data is processed by a third level of decoding that helps remove residual errors. Moreover, the additional error correction is gained without introducing any further redundancy to the transmitted stream of data. This is accomplished by correcting errors through the first two levels of decoding. The received data is then repacked into the original received frames and sent through a third level of decoding using the same error correcting codes used for the first level of decoding. The result is a coding gain of approximately 0.45 dB without the need to add signal redundancy.

There are many types of error-correction codes suitable for use as concatenated codes. Some examples include the linear and cyclic Hamming codes, the cyclic Bose-Chaudhuri-Hocquenghem (BCH) codes, the convolutional (Viterbi) codes, the cyclic Golay and Fire codes, and some newer codes such as the Turbo convolutional and product codes (TCC, TPC). The codes that are frequently used for application in high bit-rate communication systems, however, are a set of cyclic, non-binary, block codes known as Reed-Solomon (RS) codes.

Concatenated codes are designed to have a strong first-level (inner) code (e.g. t=16) followed by a weaker second-level (outer) code (e.g. t=8), with an interleaving step in between the two. Interleaving re-distributes or "spreads" the errors from an undecodable inner code block over several outer code blocks. The re-distribution or spreading of errors brings the average number of errors per code block to within the error-correction capability of the code at least at the outer decoding level. The interleaver provides an FEC coding improvement corresponding to the depth of interleaving ("interleave depth") as discussed below.

One embodiment of the invention utilizes RS error correcting codes. An RS code word consists of a "block" of n "symbols", k of which represent the data, with the remaining (n–k) symbols representing the redundancy or check symbols. These check symbols are appended to the data symbols during the encoding step, and are used to uniquely detect and correct bit errors at the decoder, within the error-correction capability of the code. After the decoding operation, the check symbols are stripped from the block, and the corrected data symbols are obtained. The data symbols themselves are left unmodified during the encoding step, and it is for this reason that the RS code is referred to as a "systematic" code. The rate of the RS code is the ratio of data symbols (or equivalently, bits) to code-word symbols (or bits). The overhead of the code is the ratio of the check symbols to code-word symbols, i.e., the overhead=((1/rate)–1).

The non-binary nature of block RS codes is manifest in the fact that a code symbol is not exactly a bit but rather it consists of several bits. The typical symbol size m is 8 bits, or a standard byte. The number of check symbols used determines the error-correction capability of a particular RS code. For example, a code that can correct t symbol errors in a block of n symbols requires at least 2t check symbols, so that the number of data symbols that can be transmitted in this block is k=n–2t. Furthermore, for a given symbol size m, the maximum number of symbols per block, n, has to be less than or equal to $2^m-1$ to ensure unique decodability. For example, for m=8, there is n=255, and for t=8 symbol errors in this case, the maximum number of data symbols is k=239. This is represented in compact form as a 255/239 (n/k) RS code.

RS error correcting schemes also include the use of a shortened RS code. A shortened RS code is one where some of the data symbols are left unused. For example, a shortened 223/207 RS code of length n*=(n–s)=223 symbols transmits 207 data symbols in a block with error correction capability of up to 8 symbol errors. The disadvantage of shortened codes, relative to full-length codes, is that they are rate-inefficient. Some practical considerations, such as the maximum number of code-word symbols having to be n*(<n) in some cases, however, may actually require this form. Shortened codes are implemented in both software and hardware by transforming a (n–s)/(k–s) RS code to a n/k code by padding s dummy symbols (e.g. 0) before encoding. At the decoder, this operation is reversed. After decoding, the padded symbols are stripped from the block.

The decodability of the RS code can be demonstrated with a brief example. If the bit-error rates (BER) of the transmission channel is such that only a single symbol error is expected (t=1), 2t check symbols are required. In the case of an 8-bit symbol (m=8), this translates to 16 check bits. Of the 16 bits in this code, 8 bits are used to uniquely locate the symbol error (one out of $2^8$=256 possibilities, corresponding to one out of 255 symbol positions, in addition to the error-free case). The remaining 8 bits are used to uniquely determine the error pattern (one out $2^8$=256 error patterns, including the error-free pattern). Various procedures for encoding RS code words are well-known in the art, and therefore will not be further described herein.

The use of concatenated codes provides relatively powerful error correction with relatively little additional processing power. The overhead of a 2-level concatenated RS code can be calculated as $(r_1 \cdot r_2)^{-1}-1$, where $r_1$ and $r_2$ are the rates of the inner and outer codes, respectively. The concatenated RS code itself can be represented in compact form as $n_2/k_2-n_1/k_1$, where the subscripts 1 and 2 represent the inner and outer codes, respectively. Conventional FEC coding schemes (e.g., RS 255/239) provide a transmission performance improvement equivalent to a Q-factor of about 5 dB while providing 7% extra bits as redundancy. One embodiment of the invention uses a concatenated RS code that provides an additional coding gain of approximately 2 dB while providing and extra 16% redundancy bits (a total of 23%). The embodiment uses an FEC encoder/decoder using a concatenated RS coding scheme with interleaving between the stages. More particularly, the FEC encoder/decoder utilizes a concatenated RS code of 223/207–255/223.

At least two important discoveries were significant in implementing concatenated codes in long-haul communication systems. The first was the recognition that concatenated codes having an inner code that is stronger (i.e., lower code rate) than the outer code (i.e., higher code rate) is particularly useful in such systems. The second was the recognition that the class of codes utilized for the concatenated code significantly impacted system design.

With respect to the second discovery, two types of combinations were considered particularly advantageous for long-haul communication systems. The first combination comprised a bit-based BCH inner code and a byte-based BCH outer code (referred to herein as "BCH-RS concatenated code"). This is because bit-based BCH codes are good for more uniformly distributed errors while RS codes are good for "bursty" channels. When an inner decoder cannot correct all the errors on the line, it starts generating bursts that can then be effectively handled by the outer RS decoder. The second combination comprised a pair of RS codes (referred to herein as "RS-RS concatenated code"). RS codes having a range from t=2 to t=16 were examined, with t representing a code strength that is defined as the maximal possible number of corrected symbols per code word. The examination revealed that the concatenation of two RS codes of different strength would be particularly effective for undersea systems, provided that the outer code is interleaved before it is concatenated with the inner code. Interleaving is a technique that is normally used to spread bursty errors among several consecutive code words. In this case an interleaver is inserted between the two concatenated codecs so that the inner and the outer decoding processes are statistically de-correlated. In general practice, the greater the interleave depth the better coding performance is gained.

The BCH-RS concatenated code and the RS-RS concatenated code each offers advantages according to the needs and constraints of a particular system. For example, the BCH-RS concatenation is good for channels that are both uniform and bursty in nature. The RS-RS concatenation is particulary good for bursty environments. Consequently, the RS-RS concatenation is well-suited to undersea communications systems since undersea channels are more bursty in nature.

Another important aspect of implementing an enhanced FEC system concerns digital frame alignment and synchronization in a very noisy environment. This is an important implementation issue because the enhanced FEC must operate at BER values as high as $5 \times 10^{-2}$. The framing and synchronization strategies used in conventional FEC systems are inadequate for conditions where BER is greater than $10^{-4}$.

It is worthy to note that any reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Referring now in detail to the drawings wherein like parts are designated by like reference numerals throughout, there is illustrated in FIG. 1 a system suitable for practicing one embodiment of the invention. FIG. 1 is a block diagram of a long-haul communications network 100 comprising a communications transmitter/receiver ("transceiver") 102 and a transceiver 108 connected via a network 106. Transceivers 102 and 108 each include a FEC encoder/decoder ("FEC codec") 104 and a FEC codec 110, respectively. In this embodiment of the invention, long-haul communications network 100 is a conventional long-haul optically amplified undersea communication system with the optical transceivers modified to operate with a novel FEC codec performing in accordance with a novel concatenated FEC coding scheme and three levels of decoding. Network 100 in general, and network 106 in particular, are designed to transport optical signals over distances greater than 600 kilometers.

Figure 2:
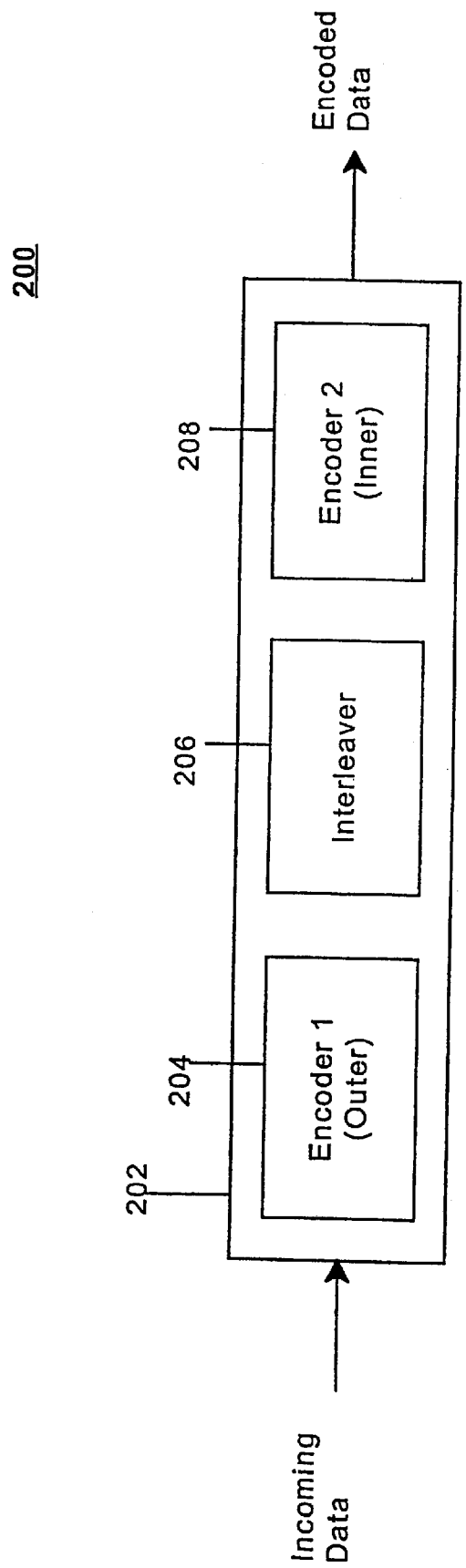
FIG. 2 is a block diagram of a FEC encoder in accordance with one embodiment of the invention.

FIG. 2 is a block diagram of a FEC encoder in accordance with one embodiment of the invention. FIG. 2 illustrates a FEC encoder 200 representative of the structure performing the concatenated encoding function of FEC codecs 104 and/or 110. FEC encoder 200 comprises a first encoder 204, an interleaver 206 and a second encoder 208. First encoder 204 is also referred to herein as an "outer encoder." Second encoder 208 is also referred to herein as an "inner encoder." The operation of FEC encoder 200 will be discussed in more detail below with reference to FIGS. 4–6 and accompanying examples.

Figure 3:
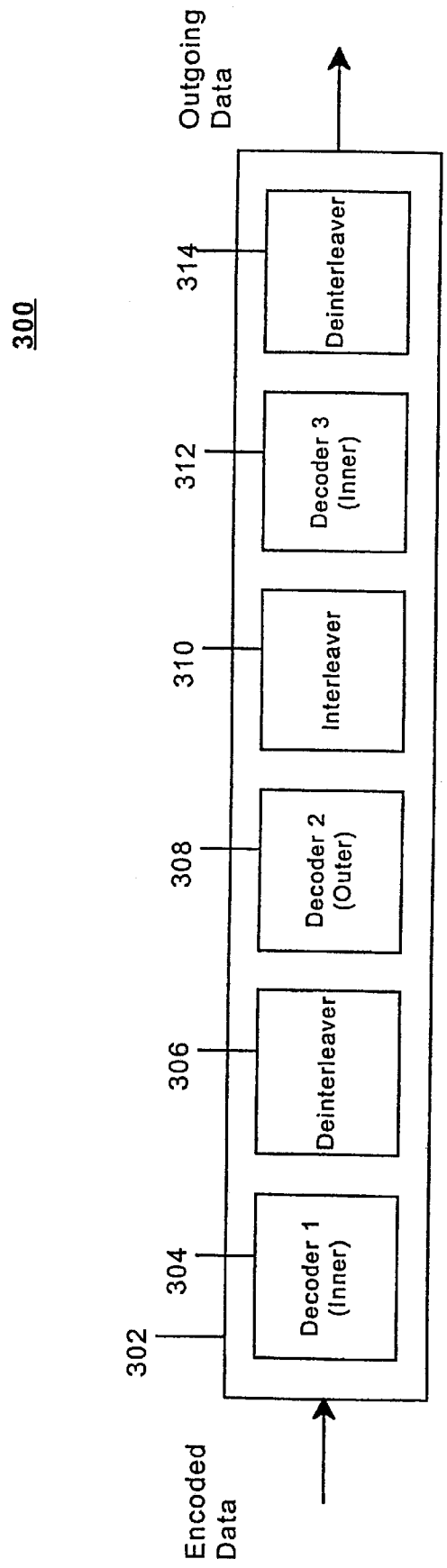
FIG. 3 is a block diagram of a FEC decoder in accordance with one embodiment of the invention.

FIG. 3 is a block diagram of a FEC decoder in accordance with one embodiment of the invention. FIG. 3 illustrates a FEC decoder 300 representative of the structure performing the concatenated decoding function of FEC codecs 104 and/or 110. FEC decoder 300 comprises a first decoder 304, a deinterleaver 306, a second decoder 308, an interleaver 310, a third decoder 312 and a deinterleaver 314. First decoder 304 and third decoder 312 are also referred to herein as "inner decoders." Second decoder 308 is also referred to herein as an "outer decoder." The operation of FEC decoder 300 will also be discussed in more detail below with reference to FIGS. 4–6 and accompanying examples.

For purposes of clarity, the encoding structure and functionality (i.e., FEC encoder 200) is discussed separately from the decoding structure and functionality (i.e., FEC decoder 300). It can be appreciated, however, that both the encoding and decoding structure and functionality can be combined into a single FEC codec (e.g., FEC codecs 104 and 110) and still fall within the scope of the invention.

Figure 4:
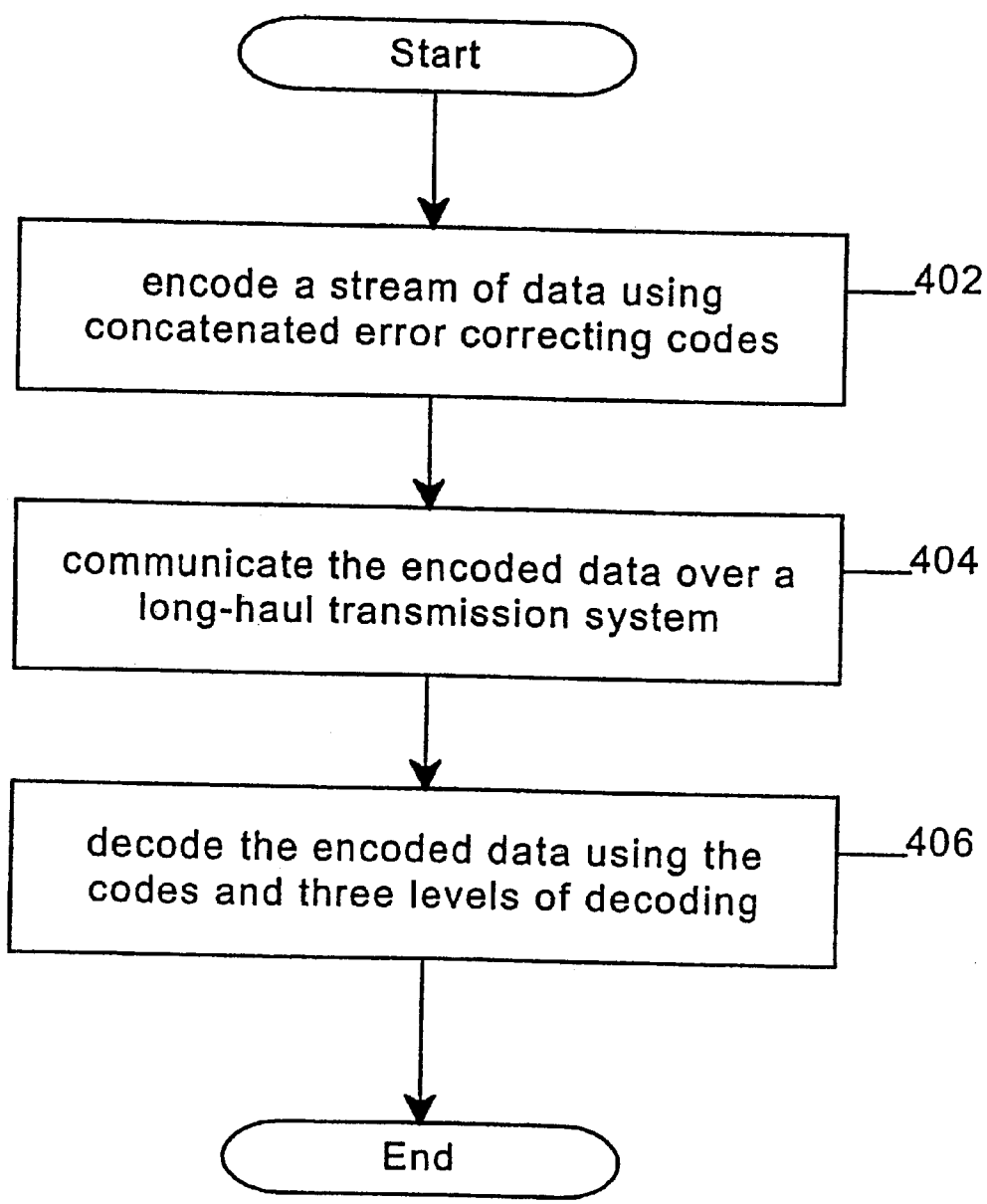
FIG. 4 is a block flow diagram of the operations performed by an FEC codec in accordance with one embodiment of the invention.
Figure 5:
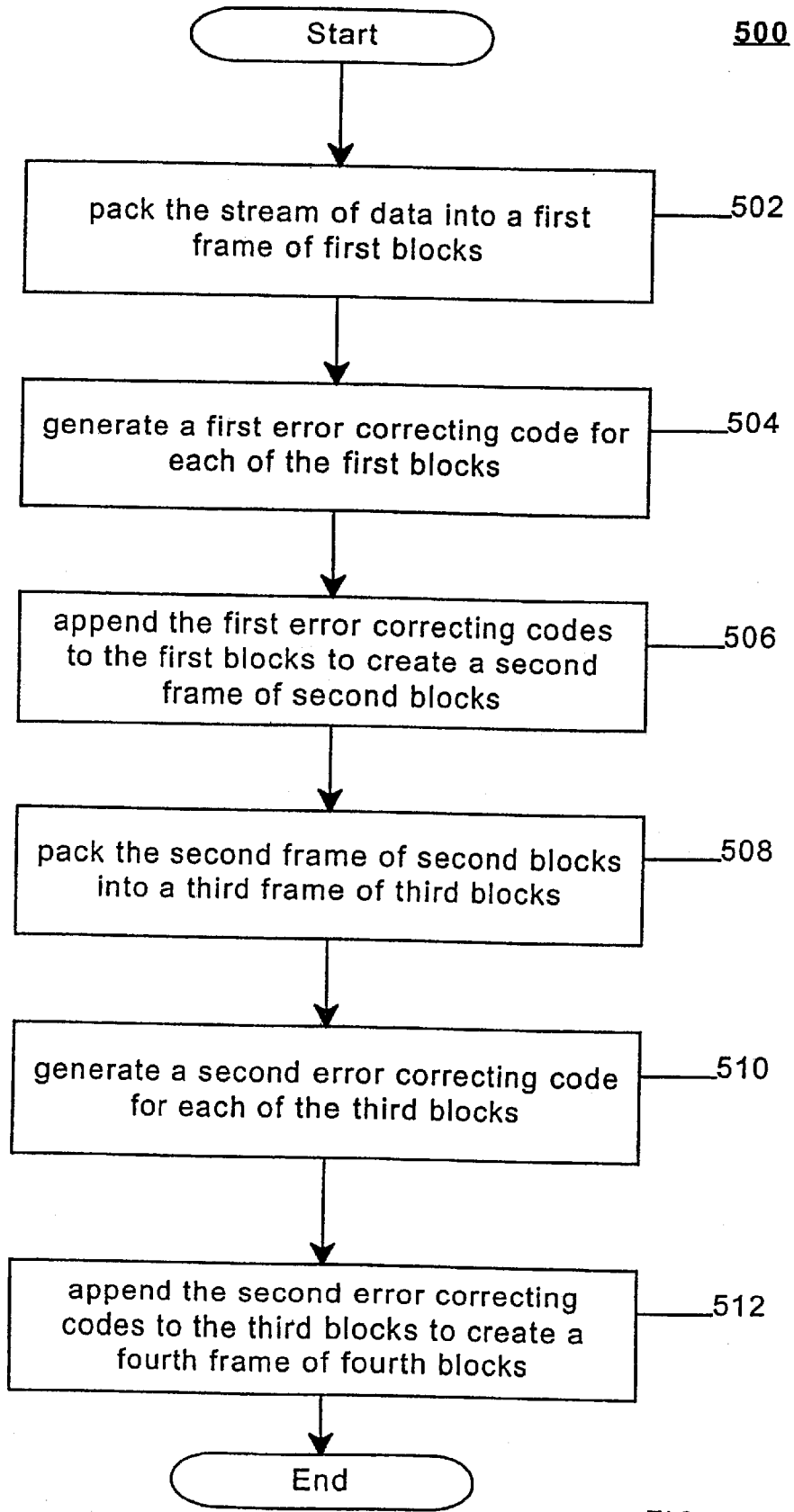
FIG. 5 is a block flow diagram of an encoding process in accordance with one embodiment of the invention.
Figure 6:
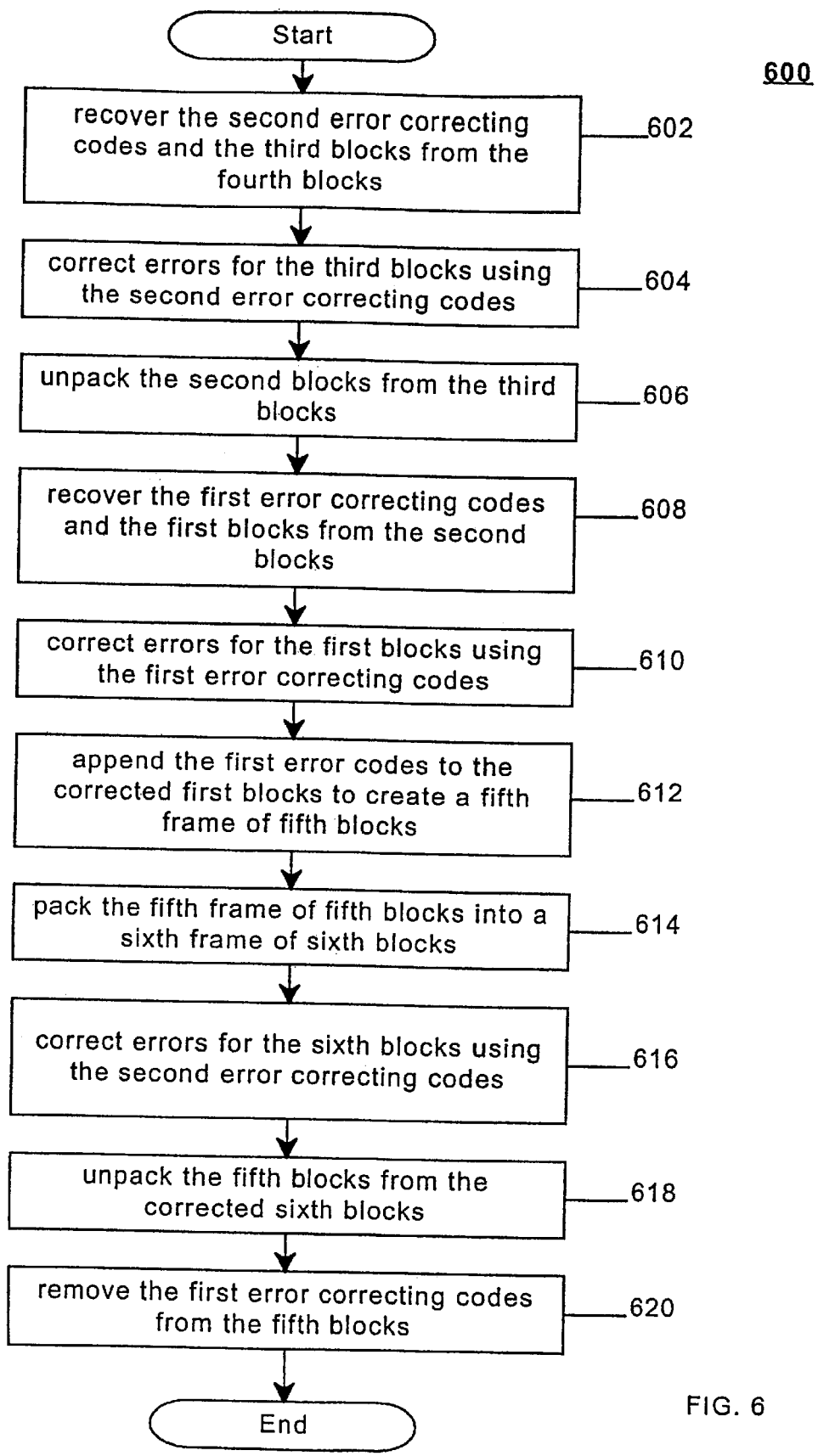
FIG. 6 is a block flow diagram of a decoding process in accordance with one embodiment of the invention.

The operation of systems 100, 200 and 300 will be described in more detail with reference to FIGS. 4–6. Although FIGS. 4–6 presented herein include a particular sequence of steps, it can be appreciated that the sequence of steps merely provides an example of how the general functionality described herein can be implemented. Further, each sequence of steps does not have to be executed in the order presented unless otherwise indicated.

FIG. 4 is a block flow diagram of the operations performed by an FEC encoder in accordance with one embodiment of the invention. In this embodiment of the invention, FEC encoder 202 performs the FEC encoding. An example of an encoding process suitable for use in one embodiment of the invention is described in "A". FIG. 4 illustrates a FEC process 400. A stream of data is encoded using concatenated error correcting codes at step 402. The encoded data is communicated over a long-haul transmissions system at step 404. In one embodiment of the invention the long-haul transmission system communicates the encoded data at least 600 kilometers. The encoded data is decoded using the error correcting codes and three levels of decoding at step 406.

FIG. 5 is a block flow diagram of an encoding process in accordance with one embodiment of the invention. FIG. 5 illustrates an encoding process 500 that is representative of step 402 described with reference to FIG. 4. The stream of data is packed into a first frame of first blocks at step 502. The first frame is also referred to herein as an "unencoded outer frame." A first error correcting code is generated for each of the first blocks at step 504. The first error correcting codes are appended to the first blocks to create a second frame of second blocks at step 506. The second frame is also referred to herein as an "encoded inner frame." The second frame of second blocks is packed into a third frame of third blocks at step 508. The third frame is also referred to herein as an "unencoded inner frame." A second error correcting code is generated for each of the third blocks at step 510. The second error correcting codes are appended to the third blocks to create a fourth frame of fourth blocks at step 512. The fourth frame is also referred to herein as an "encoded outer frame."

The first frame, second frame, third frame and fourth frame each have a predetermined length. In one embodiment of the invention, the length of the second frame matches the length of the third frame. In this manner, no padding is required for the third frame. This decreases the latency associated with such padding hardware and techniques. In alternative embodiments, however, the length of the second frame is less than the length of said third frame. In such a case, the third frame is padded with padding symbols until the length of the third frame matches the length of the second frame. In this case, the increase in FEC coding efficiency is sufficient to compensate for the latency incurred by padding.

The embodiments of the invention use interleaving during the encoding and decoding process. More particularly, the interleaving operation occurs during the packing of the second blocks from the second frame into the third blocks of the third frame, and vice-versa. It can be appreciated, however, that the interleaving process can occur as a separate step from the packing process and still fall within the scope of the invention. The interleaving operation can be either bit interleaving or byte interleaving. In one embodiment of the invention, the third frame has a number 1–N of third blocks, with N matching an interleave depth for the encoding process. In one advantageous embodiment N=64, while in another N=16.

The error correcting codes can be any code from a group comprising the linear and cyclic Hamming codes, the cyclic BCH codes, the convolutional Viterbi codes, the cyclic Golay and Fire codes, and some newer codes such as TCC and TPC. The concatenated error correcting code pair may be separately represented as a first and second error correcting code, with the first error correcting code represented as x/y, and the second error correcting code represented as z/x. In one embodiment of the invention, the first error correcting code is a reed-solomon code. More particularly, the first error correcting code is a x/207 reed-solomon error correcting code. The second error correcting code is also a reed-solomon code. The second error correcting code is a 255/x reed-solomon error correcting code. In one advantageous embodiment of the invention, the x is equal to 223 symbols. This two level FEC coding results in a net coding gain of approximately 1.8 decibels while performing at a bit error rate of $10^{-10}$, without taking into account the coding gain given by the third level of decoding which is approximately 0.45 dB (as described more fully below). This embodiment adds a redundancy percentage to the communicated encoded data of approximately 23 percent (including the third level of decoding).

In an alternative embodiment of the invention, the first error correcting code is one of a group comprising a bit based BCH code and a byte based BCH code. The second error correcting is also one of a group comprising a bit based BCH code and a byte based BCH code. Further, the first error correcting code is stronger than the second error correcting code.

FIG. 6 is a block flow diagram of a decoding process in accordance with one embodiment of the invention. FIG. 6 illustrates a decoding process 600. The decoding process 600 has three levels of decoding. In the first level of decoding, the second error correcting codes and third blocks are recovered from the fourth blocks at step 602. The second error correcting codes are used to correct errors for the third blocks at step 604. In the second level of decoding, the second blocks are unpacked from the third blocks at step 606. The unpacking process also includes a deinterleaving operation described below. The first error correcting codes and the first blocks are recovered from the second blocks at step 608. The first error correcting codes are used to correct errors for the first blocks at step 610. In the third level of decoding, the first error codes are appended to the corrected first blocks to create a fifth frame of fifth blocks at step 612. The fifth frame of fifth blocks is packed into a sixth frame of sixth blocks at step 614. The packing process also includes an interleaving operation described below. The second error correcting codes are used to correct errors for the sixth blocks at step 616. The fifth blocks are unpacked from the corrected sixth blocks at step 618. The unpacking process also includes the deinterleaving operation described below. The first error correcting codes are removed from the fifth blocks to leave the received corrected data at step 620.

Figure 7:
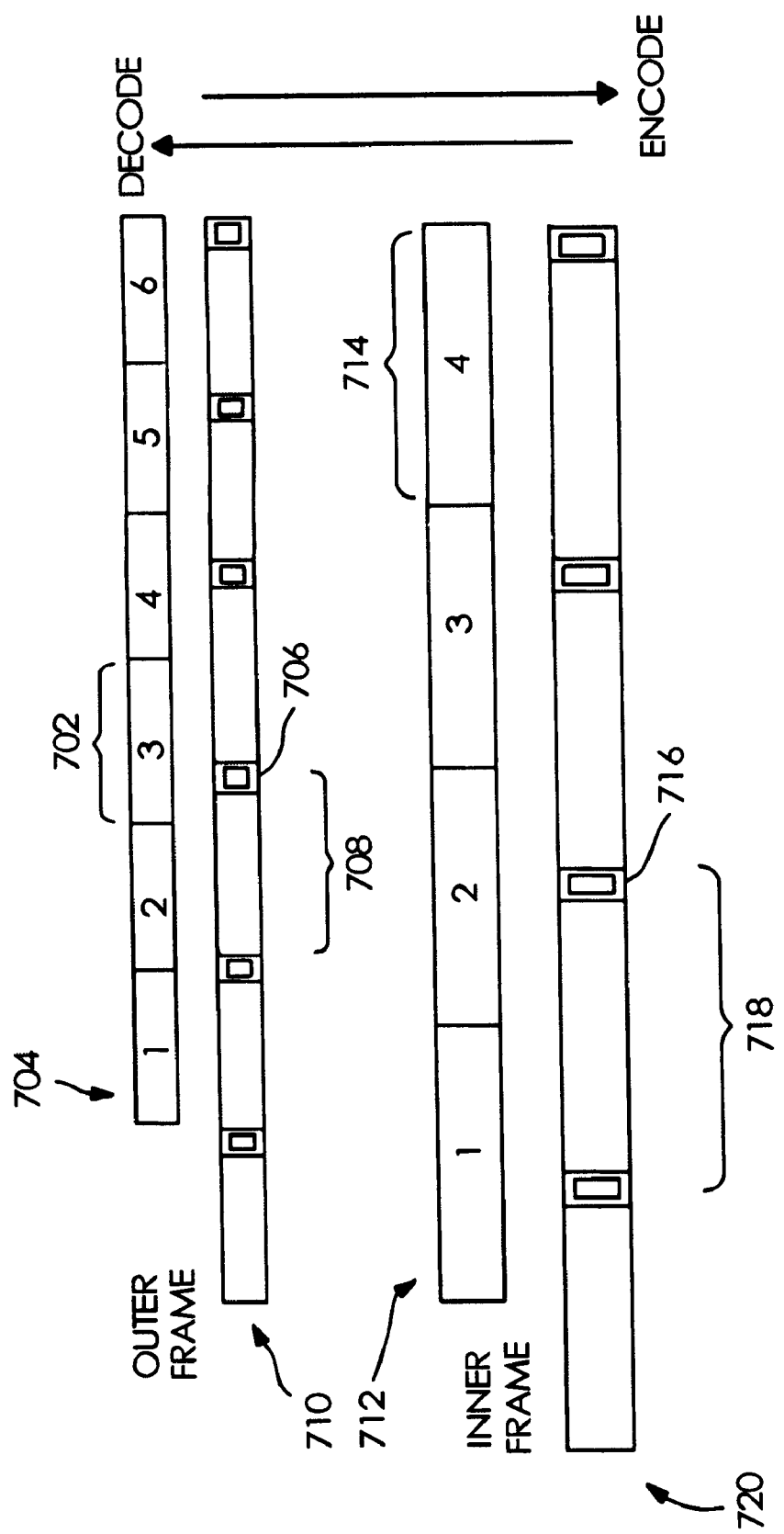
FIG. 7 is an illustration of how code blocks are packed into a frame in the encoding step.

FIG. 7 is an illustration of how code blocks are packed into a frame in the encoding step. An integral number of first blocks 702 at the first (outer) encoding level are packed into a first frame 704 (i.e., the unencoded outer frame). Check symbols 706 for first blocks 702 are generated by a first encoder (e.g., first encoder 204) of a FEC encoder (e.g., FEC codec 104 or FEC encoder 200). Check symbols 706 are appended to first blocks 702 to form second blocks 708. Second blocks 708 are packed into a second frame 710 (i.e., the encoded outer frame). The bits (or bytes) from second blocks 708 are interleaved, and they are packed into third blocks 714 of a third frame 712 (i.e., unencoded inner frame). In this example, second frame 710 and third frame 712 have the same length in terms of bits (or bytes), although the block size will likely vary between the two frames. In other words, third frame 712 is required to be an integral number of third blocks 714, the size of which is different from that of second blocks 708. Thus, in order for second frame 710 and third frame 712 to be of the same length, the number of second blocks 708 and third blocks 714 per frame in each of these frames, respectively, has to be chosen appropriately.

If second frame 710 and third frame 712 cannot be made to match with an integral number of blocks, third frame 712 is padded or "stuffed" with dummy symbols until they are of equal length. The padding process, however, represents an increase in latency in a hardware implementation, or increased processing time in software. In one embodiment of the invention, the lengths of the frames are therefore chosen to minimize the number (or reduce to zero) of stuffed symbols, while at the same time keeping the number of second blocks per second frame to a minimum.

Once second blocks 708 from second frame 710 are packed and interleaved into third blocks 714 of third frame 712, check symbols 716 are generated for third blocks 714 by a second encoder (e.g., second encoder 208) of an FEC encoder (e.g., FEC codec 104 or FEC encoder 200). Check symbols 716 are appended to third blocks 714 to form a set of fourth blocks 718 of a fourth frame 720 (i.e., the encoded inner frame). Once the two-level encoding process is performed, the encoded data stream is communicated to a transceiver (e.g., transceiver 108) for decoding by a FEC decoder (e.g., FEC codec 110 or FEC decoder 300).

Figure 8:
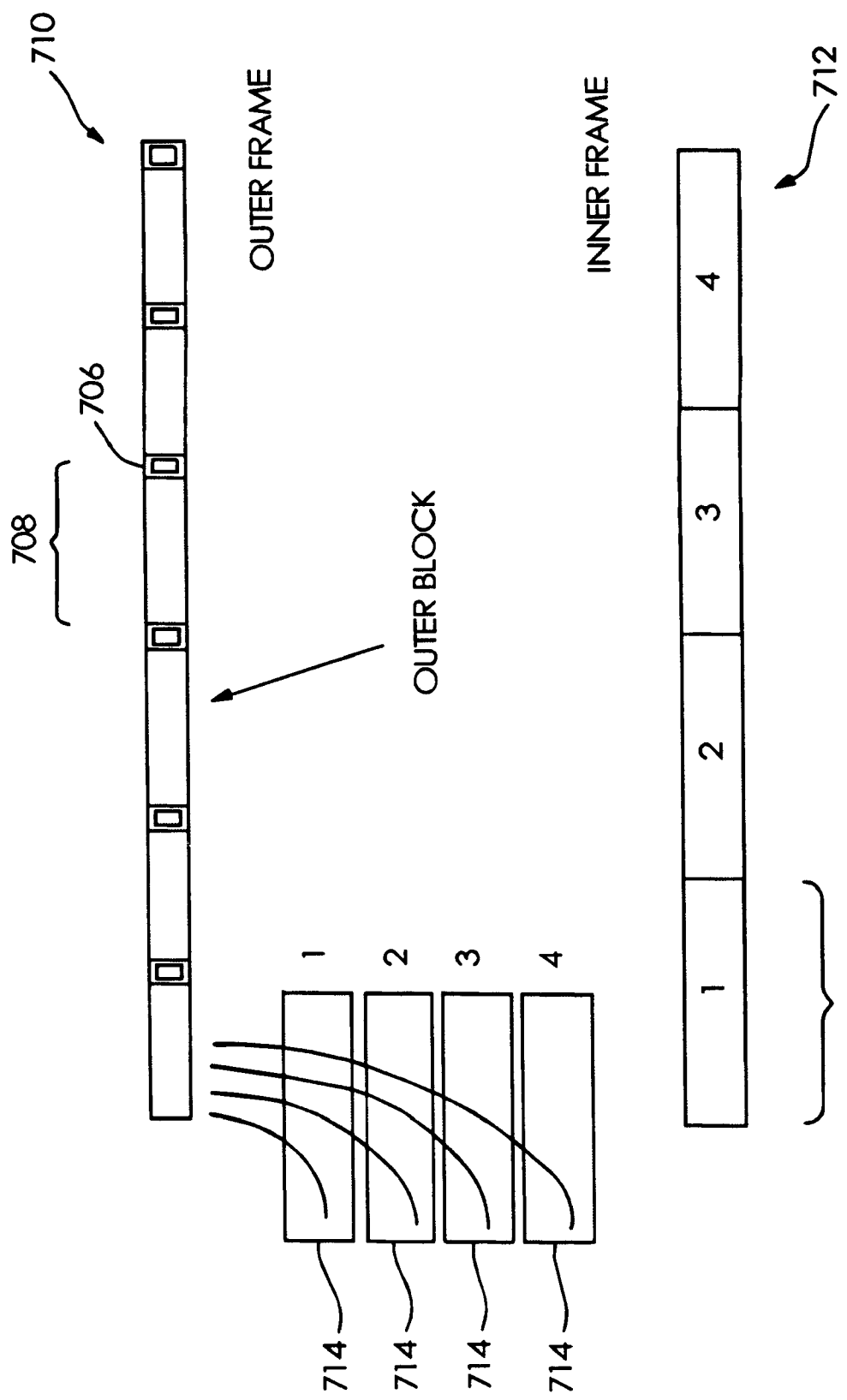
FIG. 8 is an illustration of the interleaving process in accordance with one embodiment of the invention.

FIG. 8 is an illustration of the interleaving process in accordance with one embodiment of the invention. As shown in FIG. 8, interleaving between the two encoding steps discussed with reference to FIG. 7 (between packing the second and third frames) amounts to re-distributing the errors in bit-groupings or bytes that are either 1-bit or 8-bits long. FIG. 8 illustrates an example of byte interleaving after second frame 710 is encoded. The improvement in error correction is directly related to the depth of interleaving. Using the example illustrated in FIG. 8, full byte (or symbol) interleaving requires that each of the 223 symbols in each second block 708 (i.e., the outer frame) is re-distributed into 223 different third blocks 714 (i.e., the inner frame). In the case of full interleaving, the 223 symbols would require an interleave depth of 223 levels or 223 third blocks 714. If full bit interleaving were required in this case, each of the 223×8 bits in each of second blocks 708 would be re-distributed into 223×8=1784 different third blocks 714. In this case, the interleave depth is 1784 levels. Although full bit or byte interleaving improves the error correction, the disadvantage of full interleaving is the large amount of memory required and the additional latency in a practical implementation.

As mentioned previously, steps 606 and 618 refer to an unpacking process that includes a deinterleaving process. The deinterleaving process essentially reverses the interleaving process described with reference to FIG. 8.

The operation of systems 100, 200 and 300, and the flow diagram shown in FIGS. 4–6, can be better understood by way of example. As described above, the concatenated RS codes involve two independent levels of RS encoding, with an interleaving step in between them. The decoding process includes three independent levels of RS decoding, with a deinterleaving step in between levels one and two, and an interleaving step and deinterleaving step between levels two and three.

As stated previously, the three level decoding process described with reference to FIG. 6 provides a coding gain of approximately 0.45 dB without adding any redundancy to the transmitted signal. A transceiver such as transceiver 102 receives a stream of data for transmission over network 106. Transceiver 102 utilizes FEC codec 104 to provide forward error correction to the data stream prior to transmission over network 106. The encoded data stream is then transmitted over network 106 to transceiver 108. Transceiver 108 receives the encoded data stream and begins the decoding process using FEC codec 110. FEC codec 110 performs three levels of decoding.

The first level of decoding is performed by decoder 304 (i.e., inner decoder) of decoder 300 (that is part of FEC codec 110). Decoder 304 receives the fourth frame of fourth blocks (i.e., the encoded inner frame) and recovers the second error correcting codes (i.e., inner codes) and third blocks (i.e., of the third frame) from the fourth blocks. Decoder 304 corrects errors for the third blocks using the second error correcting codes. The level of error correction is determined by the strength of the particular second error correcting codes.

The second level of decoding is performed by decoder 308 (i.e., outer decoder) of decoder 300. The corrected third blocks are received by deinterleaver 306. Deinterleaver 306 reverses the interleaving process used to pack the second blocks of the second frame into the third blocks of the third frame during the encoding process. The unpacking and deinterleaving process produces the second blocks of the second frame from the third 99 blocks. Decoder 308 receives the second blocks and recovers the first error correcting codes (i.e., outer codes) and the first blocks (i.e., original data) from the second blocks. Decoder 308 corrects errors for the first blocks according to the particular strength of the first error correcting code.

The third level of decoding is performed by decoder 312 (i.e., inner decoder) of decoder 300. The third level of decoding utilizes the second error correcting codes (i.e., inner codes) to correct errors in the corrected first and third blocks. This builds upon the basic premise of concatenated codes. To the extent the inner decoder cannot correct all the errors in the received information, the deinterleaver and the outer decoder may correct any unresolved errors. There may be an instance, depending on the strength of the inner and outer codes, that a number of errors remain despite the first two levels of decoding. By reformulating the corrected data into the same format as originally received (i.e., the third blocks), the corrected data (which may still have some uncorrected errors) can be sent through the inner decoder again in an attempt to correct any remaining errors. Although it seems that additional coding gain could be achieved by resending the received information through the outer decoder again, this is typically not effective for several reasons. First, the inner decoder typically utilizes the strongest error correcting code due to the advantages gained in terms of efficiency versus redundancy. Consequently, the greatest amount of additional error correction would come from the inner decoder. Second, the outer decoder provides relatively little, if any, additional coding gains, as demonstrated in FIG. 9.

Figure 9:
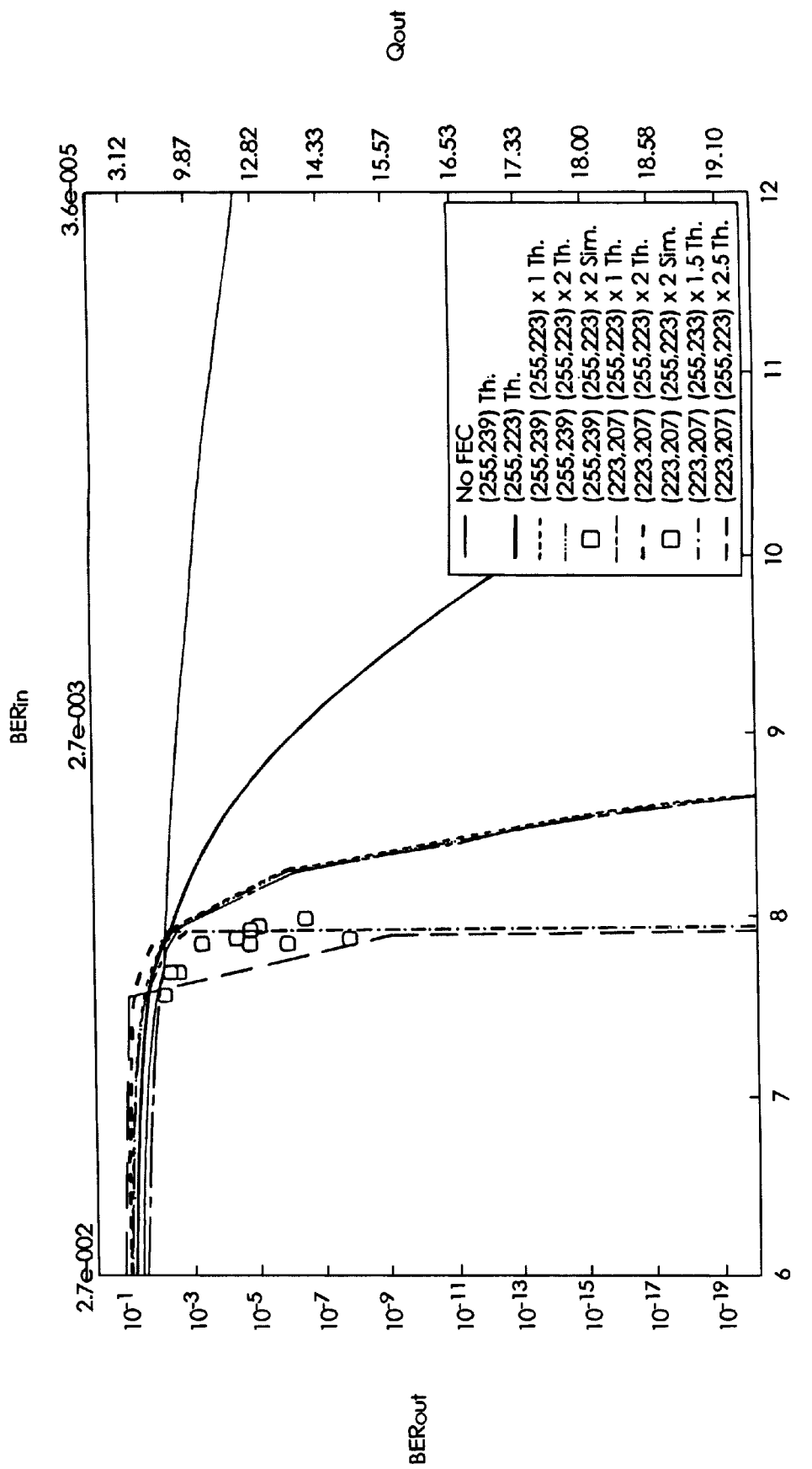
FIG. 9 is a plot of coding gains from three level and four level decoding in accordance with one embodiment of the invention.

FIG. 9 is a plot of coding gains from three level and four level decoding in accordance with one embodiment of the invention. As illustrated in FIG. 9, the third level decoding (i.e., sending the data through the inner decoder again) and fourth level decoding (i.e., sending the data through the outer decoder again) both result in the same additional FEC gain of approximately 0.45 dB. Therefore, by sending the data through a fourth level of decoding would merely add latency without any appreciable coding gain for the system.

Returning again to our example of the third level decoding, the third blocks must be reconstructed prior to sending them through the inner decoder again (e.g., decoder 312). Thus, the first error codes are appended to the corrected first blocks to create a fifth frame of fifth blocks. The fifth frame of fifth blocks equates to the reconstructed second frame of second blocks. The fifth frame of fifth blocks is packed into a sixth frame of sixth blocks. The sixth frame of sixth blocks equates to the reconstructed third frame of third blocks. This is accomplished by sending the fifth frame of fifth blocks through interleaver 310. Decoder 3 12 receives the sixth blocks, uses the second error correcting codes to correct errors for the sixth blocks, and sends the corrected sixth blocks to deinterleaver 314. Deinterleaver 313 unpacks and deinterleaves the fifth blocks from the corrected sixth blocks. The first error correcting codes are removed from the fifth blocks to leave the outgoing data.

Although various embodiments are specifically illustrated and described herein, it will be appreciated that modifications and variations of the present invention are covered by the above teachings and within the purview of the appended claims without departing from the spirit and intended scope of the invention. For example, although an additional decoder and deinterleaver is shown as part of decoder 300, it can be appreciated that the functions of decoder 312 and deinterleaver 314 may be accomplished using decoder 304 and deinterleaver 306, respectively, using the appropriate routing circuitry, and still fall within the scope of the invention. In another example, it can be appreciated that the functionality described for the embodiments of the invention may be implemented in hardware, software, or a combination of hardware and software, using well-known signal processing techniques. If in software, a processor and machine-readable medium is required. The processor can be any type of processor capable of providing the speed and functionality required by the embodiments of the invention. For example, the processor could be a processor from the Pentium® family of processors made by Intel Corporation, or the family of processors made by Motorola. Machine-readable media include any media capable of storing instructions adapted to be executed by a processor. Some examples of such media include, but are not limited to, read-only memory (ROM), random-access memory (RAM), programmable ROM, erasable programmable ROM, electronically erasable programmable ROM, dynamic RAM, magnetic disk (e.g., floppy disk and hard drive), optical disk (e.g., CD-ROM), and any other device that can store digital information. In one embodiment, the instructions are stored on the medium in a compressed and/or encrypted format. As used herein, the phrase "adapted to be executed by a processor" is meant to encompass instructions stored in a compressed and/or encrypted format, as well as instructions that have to be compiled or installed by an installer before being executed by the processor. Further, the processor and machine-readable medium may be part of a larger system that may contain various combinations of machine readable storage devices through various I/O controllers, which are accessible by the processor and which are capable of storing a combination of computer program instructions and data. Finally, in another example, the embodiments were described using a communication network. A communication network, however, can utilize an infinite number of network devices configured in an infinite number of ways. The communication network described herein is merely used by way of example, and is not meant to limit the scope of the invention.

What is claimed is:

1. A method to perform forward error correcting comprising:

encoding a stream of data using concatenated error correcting codes comprising packing said stream of data into a first frame of first blocks, generating a first error correcting code for each of said first blocks, appending said first error correcting codes to said first blocks to create a second frame of second blocks, packing said second frame of second blocks into a third frame of third blocks by interleaving said second blocks into said third blocks, generating a second error correcting code for each of said third blocks, and appending said second error correcting codes to said third blocks to create a fourth frame of fourth blocks;

communicating said encoded data over a long-haul transmission system; and decoding said encoded data using said codes and three levels of decoding comprising recovering said second error correcting codes and said third blocks from said fourth blocks, correcting errors for said third blocks using said second error correcting codes, unpacking said second blocks from said third blocks, recovering said first error correcting codes and said first blocks from said second blocks, correcting errors for said first blocks using said first error correcting codes, appending said first error codes to said corrected first blocks to create a fifth frame of fifth blocks, packing said fifth frame of fifth blocks into a sixth frame of sixth blocks, correcting errors for said sixth blocks using said second error correcting codes, unpacking said fifth blocks from said corrected sixth blocks, and removing said first error correcting codes from said fifth blocks.

2. The method of claim 1, wherein said unpacking said second blocks from said third blocks comprises deinterleaving said third blocks into said second blocks.

3. The method of claim 1, wherein said packing said fifth frame comprises interleaving said fifth blocks into said sixth blocks.

4. The method of claim 1, wherein said unpacking said fifth blocks comprises deinterleaving said corrected sixth blocks into said fifth blocks.

5. The method of claim 1, wherein said first error correcting code is represented as 223/207 reed-solomon error correcting code, and said second error correcting code is represented as 255/223 reed-solomon error correcting code.

6. The method of claim 1, wherein said first and second error correcting codes are reed-solomon codes.

7. The method of claim 6, wherein said first error correcting code is a 223/207 reed-solomon error correcting code.

8. The method of claim 7, wherein said first error correcting code is a 255/223 reed-solomon error correcting code.

9. A machine-readable medium whose contents cause a computer system to perform forward error correcting, comprising:

encoding a stream of data using concatenated error correcting codes comprising packing said stream of data into a first frame of first blocks, generating a first error correcting code for each of said first blocks, appending said first error correcting codes to said first blocks to create a second frame of second blocks, packing said second frame of second blocks into a third frame of third blocks by interleaving said second blocks into said third blocks, generating a second error correcting code for each of said third blocks, and appending said second error correcting codes to said third blocks;

communicating said encoded data over a long-haul transmission system; and decoding said encoded data using said codes and three levels of decoding comprising recovering said second error correcting codes and said third blocks from said fourth blocks, correcting errors for said third blocks using said second error correcting codes, unpacking said second blocks from said third blocks, recovering said first error correcting codes and said first blocks from said second blocks, correcting errors for said first blocks using said first error correcting codes, appending said first error codes to said corrected first blocks to create a fifth frame of fifth blocks, packing said fifth frame of fifth blocks into said sixth frame of sixth blocks, correcting errors for said sixth blocks using said second error correcting codes, unpacking said fifth blocks from said corrected sixth blocks, and removing said first error correcting codes from said fifth blocks.

10. The machine-readable medium of claim 9, wherein said unpacking said second blocks from said third blocks comprises deinterleaving said third blocks into said second blocks.

11. The machine-readable medium of claim 9, wherein said packing said fifth frame comprises interleaving said fifth blocks into said sixth blocks.

12. The machine-readable medium of claim 9, wherein said unpacking said fifth blocks comprises deinterleaving said corrected sixth blocks into said fifth blocks.

13. The machine-readable medium of claim 9, wherein said first error correcting code is represented as 223/207 reed-solomon error correcting code, and said second error correcting code is represented as 255/223 reed-solomon error correcting code.

14. The machine-readable medium of claim 9, wherein said first and second error correcting codes are reed-solomon codes.

15. The machine-readable medium of claim 14, wherein said first error correcting code is a 223/207 reed-solomon error correcting code.

16. The machine-readable medium of claim 15, wherein said second error correcting code is a 255/223 reed-solomon error correcting code.

* * * * *